(12) United States Patent
Dossetto

(10) Patent No.: US 6,521,985 B1
(45) Date of Patent: Feb. 18, 2003

(54) METHOD FOR THE PRODUCTION OF A PORTABLE INTEGRATED CIRCUIT ELECTRONIC DEVICE COMPRISING A LOW-COST DIELECTRIC

(75) Inventor: Lucile Dossetto, La Ciotat (FR)

(73) Assignee: Gemplus, Gemenos (FR)

( * ) Notice: Subject to any disclaimer, the term of this patent is extended or adjusted under 35 U.S.C. 154(b) by 0 days.

(21) Appl. No.: 09/979,601

(22) PCT Filed: May 11, 2000

(86) PCT No.: PCT/FR00/01268

§ 371 (c)(1),
(2), (4) Date: Nov. 26, 2001

(87) PCT Pub. No.: WO00/72254

PCT Pub. Date: Nov. 30, 2000

(30) Foreign Application Priority Data

May 25, 1999 (FR) .............................................. 99 06585

(51) Int. Cl.⁷ ......................... H01L 23/02; H01L 23/495
(52) U.S. Cl. ......................... 257/678; 257/666; 257/679
(58) Field of Search ................................ 257/666, 679, 257/678, 778, 787; 361/771, 748, 760, 768, 783, 767; 235/492

(56) References Cited

U.S. PATENT DOCUMENTS 4,879,153 A 11/1989 Ohashi et al.
5,448,106 A * 9/1995 Fujitsu ........................ 257/668
5,519,936 A * 5/1996 Andros et al. ................. 29/840
5,710,695 A * 1/1998 Manteghi ..................... 361/813
5,736,428 A * 4/1998 Kasai et al. .................... 438/15

FOREIGN PATENT DOCUMENTS

| DE | 19621044 A1 | 11/1997 |
| EP | 0 246 744 A2 | 11/1987 |
| EP | 0 688 050 A1 | 12/1995 |
| EP | 0 774 779 A1 | 5/1997 |
| EP | 0813 166 A2 | 12/1997 |
| WO | WO 96/34361 | 10/1996 |

* cited by examiner

Primary Examiner—Jasmine J B Clark
(74) Attorney, Agent, or Firm—Burns, Doane, Swecker & Mathis, L.L.P.

(57) ABSTRACT

In a method for the production of a portable integrated circuit electronic device, an integrated circuit chip is transferred onto a dielectric support and connected to a metal grid comprising contact pads and connection pads. A housing is created for the chip on a metal grid by arching the grid. The dimensions of the housing enable the housing to accommodate the thickness of the card and the contact pads thereof. The grid is laminated on the dielectric support, whereby each contact pad of the card can be placed opposite to and in contact with the connection pads of the grid.

22 Claims, 5 Drawing Sheets

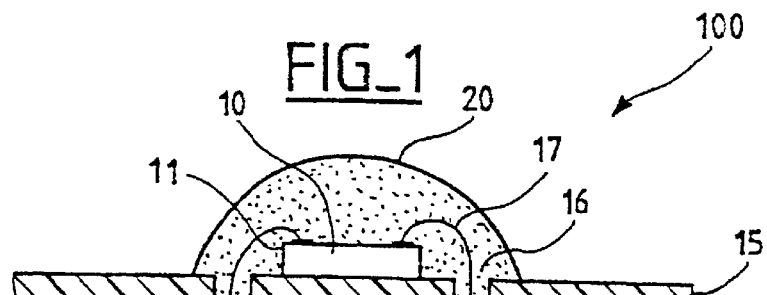
FIG_1
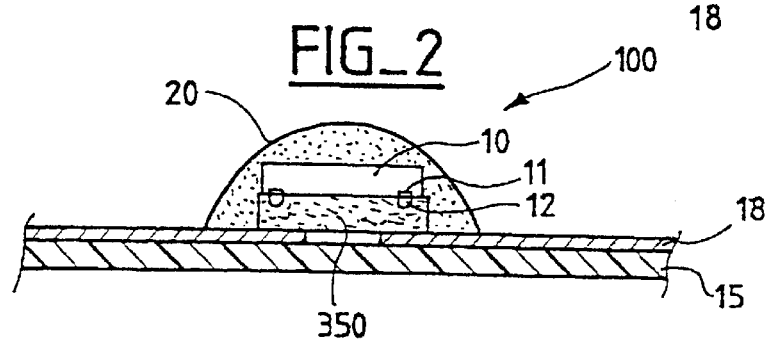
FIG_2
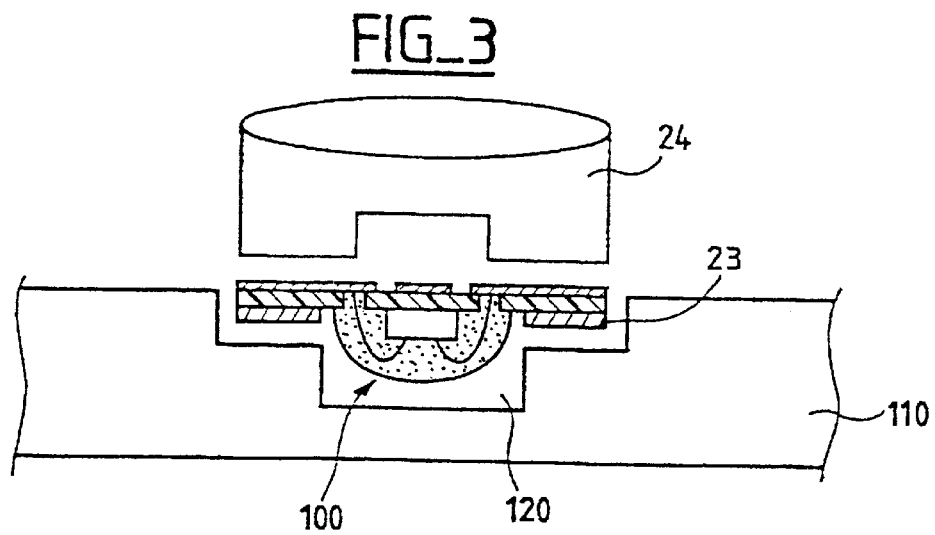
FIG_3
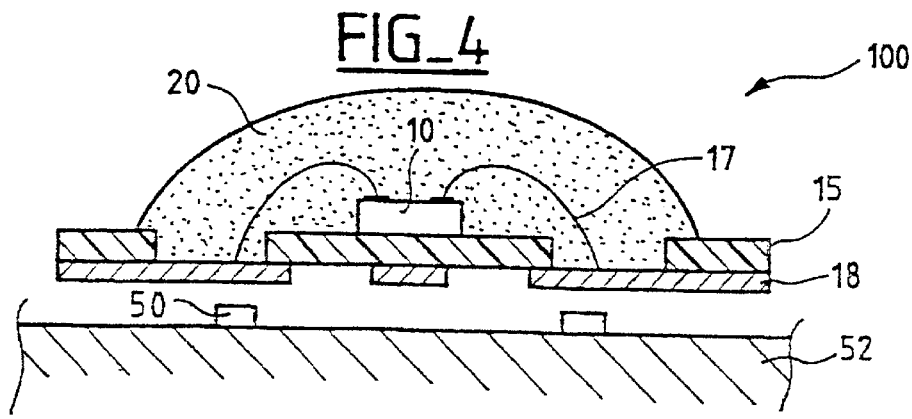
FIG_4

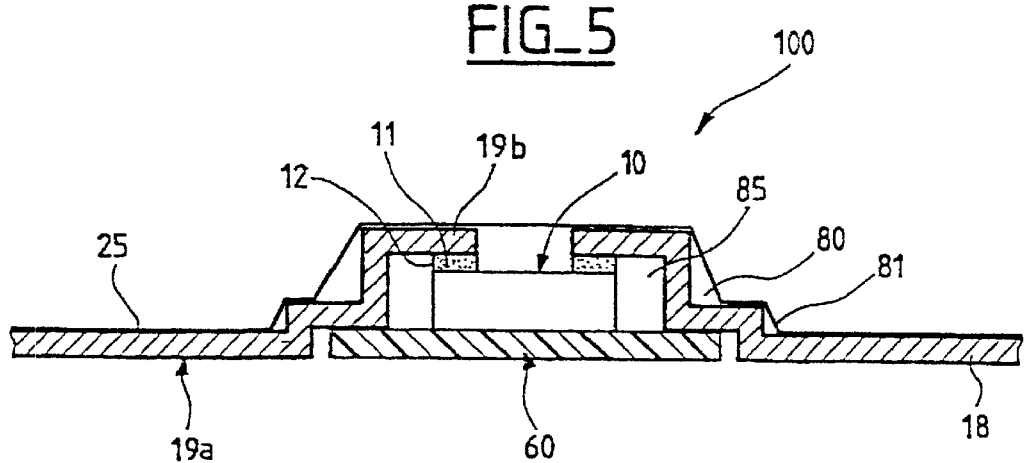
FIG_5
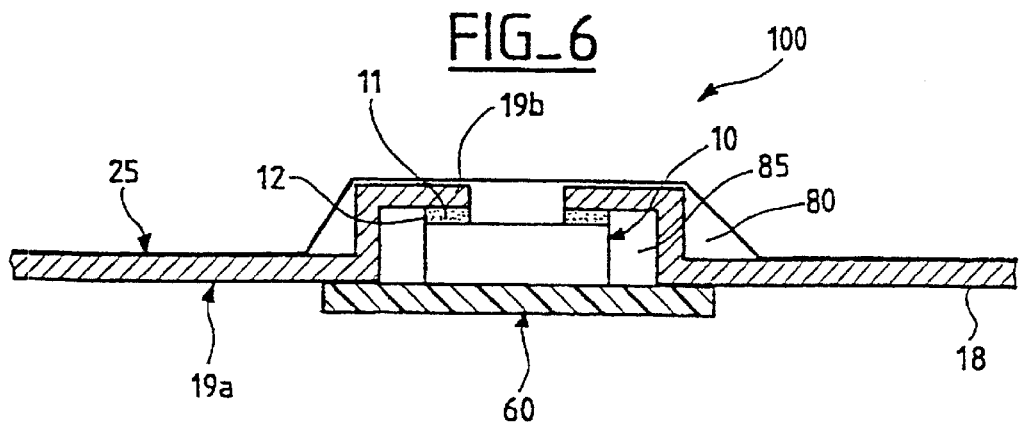
FIG_6
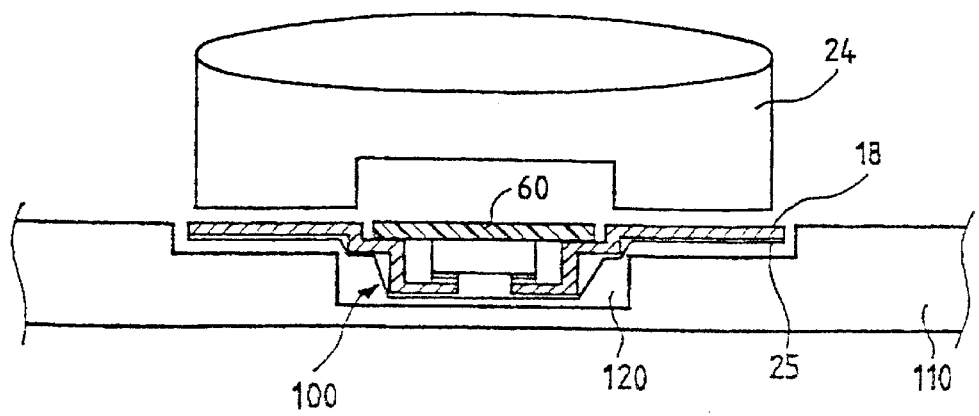
FIG_7

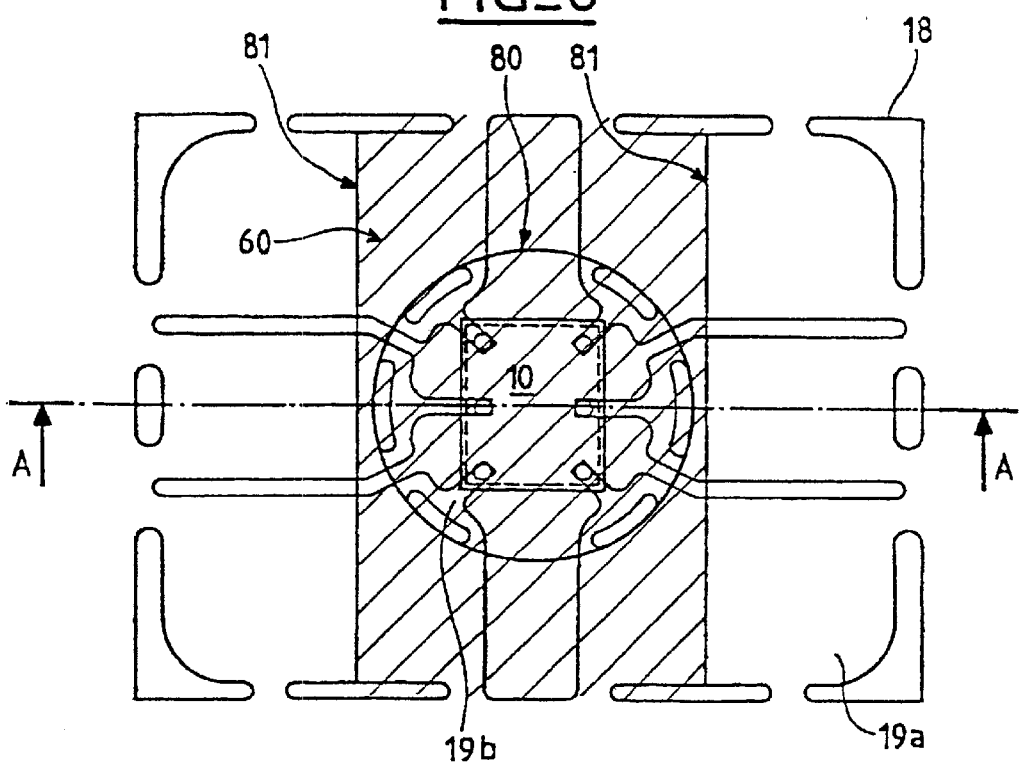
FIG_8
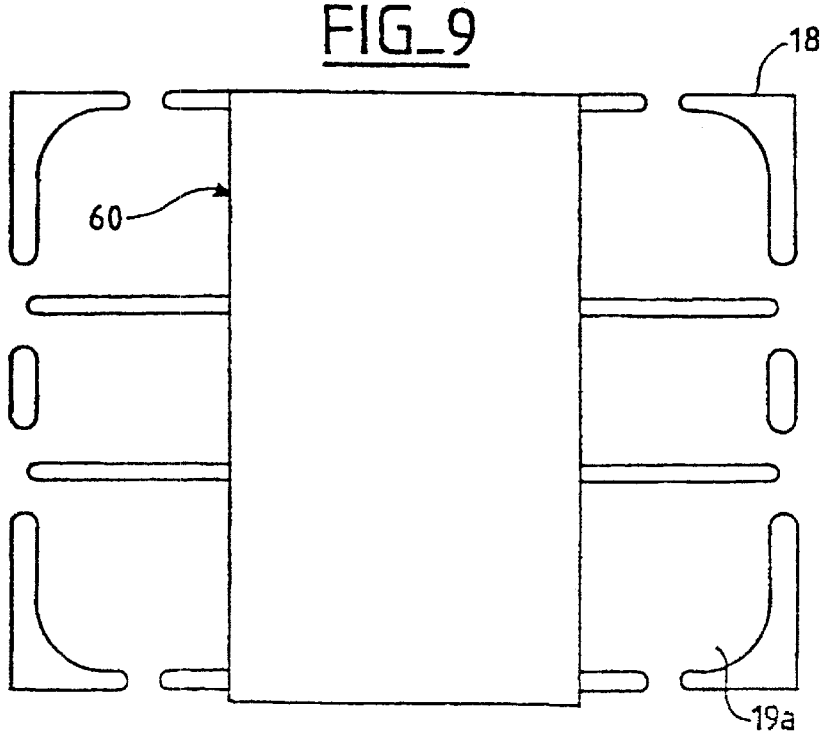
FIG_9

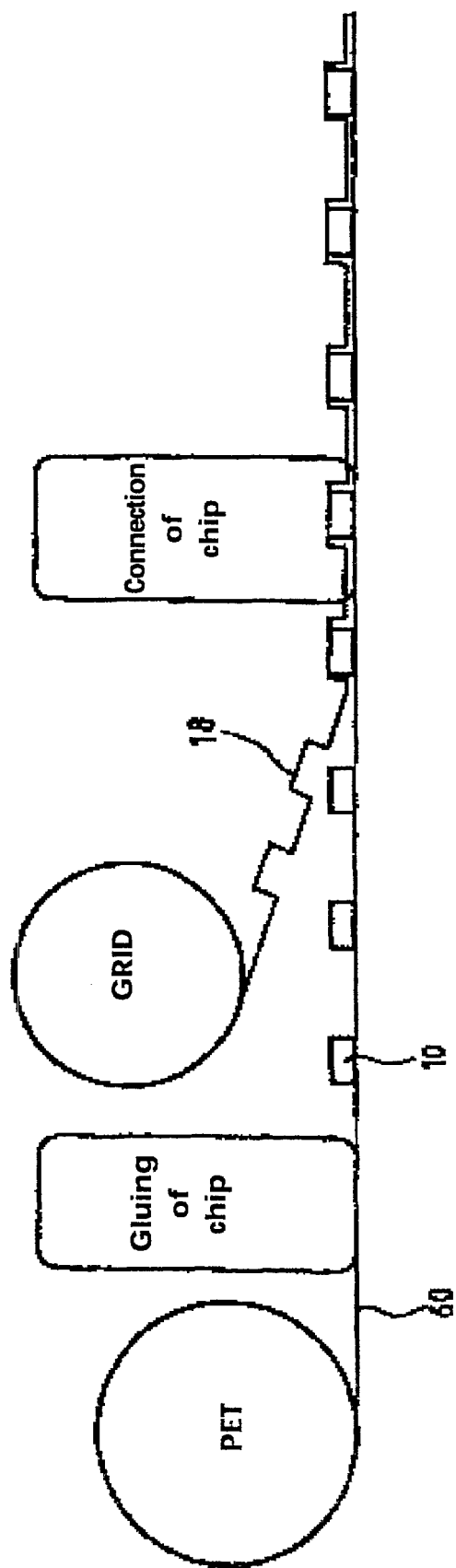

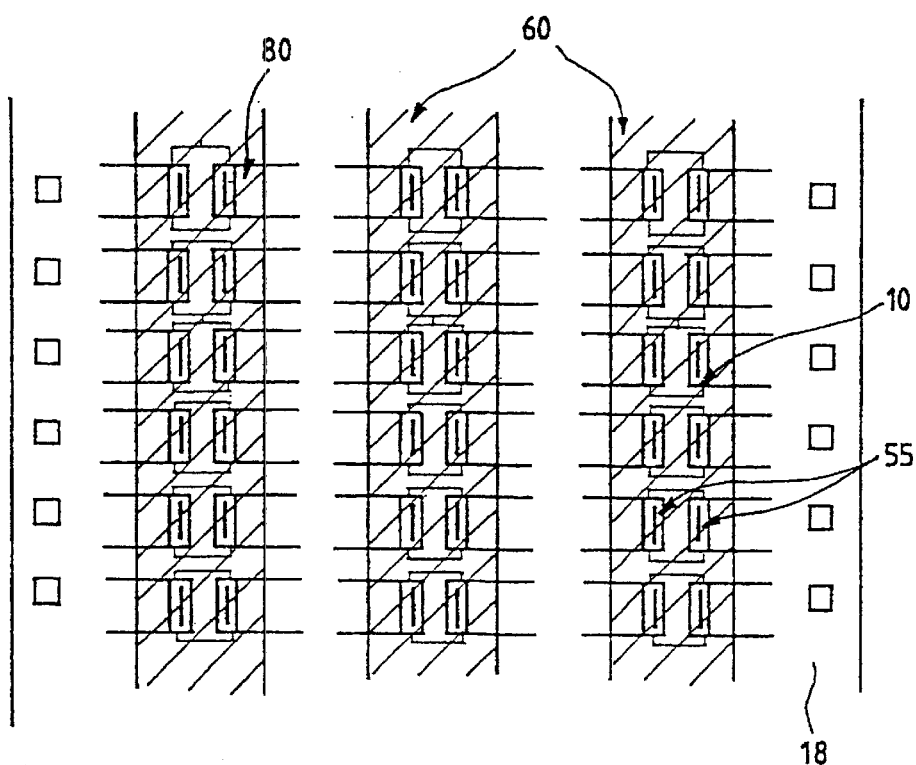
FIG_11
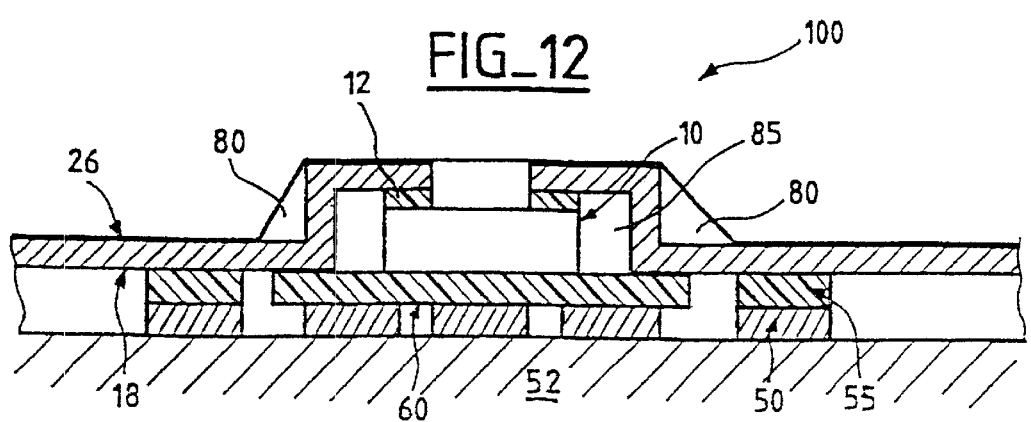
FIG_12

METHOD FOR THE PRODUCTION OF A PORTABLE INTEGRATED CIRCUIT ELECTRONIC DEVICE COMPRISING A LOW-COST DIELECTRIC

This disclosure is based upon French Application No. 99/06585, filed on May 25, 1999 and International Application No. PCT/FR00/01268, filed May 11, 2000, which was published on Nov. 30, 2000 in a language other than English, the contents of which are incorporated herein by reference.

BACKGROUND OF THE INVENTION

The present invention relates to the manufacture of a portable electronic device including at least one integrated-circuit chip embedded in a support and electrically connected to interface elements consisting of a connection terminal block and/or an antenna.

These portable electronic devices constitute for example smart cards with and/or without contacts or electronic labels.

Smart cards with and/or without contacts are intended for performing various operations such as, for example, banking operations, telephone communications, various identification operations, or operations of the cash dispensing type.

Contact cards have metallisations flush with the surface of the card, disposed at a precise point on the card body, defined by the usual standard ISO 7816. These metallisations are intended to come into contact with a reading head of a reader with a view to an electrical transmission of data.

Contactless cards have an antenna for exchanging information with the outside by means of an electromagnetic coupling between the electronics of the card and a receiving appliance or reader. This coupling can be effected in read mode or in read/write mode, and the data transmission takes place by radio frequency or microwave.

There are also hybrid cards or "combicards" which have both metallisations flush with the surface of the card and an antenna embedded in the body of the card. This type of card can therefore exchange data with the outside either in contact mode or without contact.

As currently produced, the cards, with or without contact, are thin portable elements of standard dimensions. The standard ISO 7810 corresponds to a card with a standard format 85 mm long, 54 mm wide and 0.76 mm thick.

The majority of smart card manufacturing processes are based on the assembly of the integrated-circuit chip in a subassembly referred to as a micromodule which is connected to a communication interface and inset, that is to say placed in a cavity provided in a card body, using techniques known to experts.

A conventional manufacturing method is illustrated in FIG. 1. Such a method consists in gluing an integrated-circuit chip 10, disposing its active face with its contact pads 11 upwards, and gluing its opposite face to a dielectric support sheet 15. The dielectric sheet 15 is itself disposed on a contact grid 18 such as a metallic plate made from nickel- and gold-plated copper for example. Connection wells 16 are formed in the dielectric sheet 15 in order to enable connection wires 17 to connect the contact pads 11 on the chip 10 to the contact areas on the grid 18.

According to some variants, it is possible to glue the chip 10, active face upwards, directly on the contact grid 18, and then to connect it by hard wiring 17.

In such a variant, the grid 18 is deposited on a dielectric support 15 and the contact connection areas on the said grid are defined by chemical etching or any other known means.

A protection or encapsulation step then protects the chip 10 and the soldered connection wires 17. Use is generally made of a technique known as "glob top" in English terminology, which designates the coating of the chip from above. This technique consists in pouring a drop of resin 20, based on epoxy for example, thermosetting or cross-linking under ultraviolet, on the chip 10 and its connection wires 17.

FIG. 2 illustrates a variant embodiment in which the chip 10 is connected to the metallic grid 18 according to a "flip chips" method, which designates a known technique in which the chip is turned over.

In the example illustrated, the chip 10 is connected to the metallic grid 18 by means of a glue 350 with anisotropic electrical conduction which is well known and often used for mounting passive components on a surface. The output pads 11 on the chip 10 are placed opposite the connection areas on the grid 18. This glue 350 in fact contains elastically deformable conductive particles which make it possible to establish electrical conduction along the z axis (that is to say along the thickness) when they are pressed between the output pads 11 and the connection areas on the grid 18, whilst providing insulation in the other directions (x,y).

In a variant embodiment, the electrical connection between the chip 10 and the grid 18 can be improved by protrusions 12, made from hot-melt alloy of the Sn/Pb type or conductive polymer, produced on the pads 11 on the chip 10.

The dielectric support 15 with the chip 10 glued and protected by the resin 20 is cut in order to constitute a micromodule 100.

In the case of a smart card with contact, the micromodule 100 is inset in the cavity in a previously decorated card body. This insetting operation can be effected by depositing a liquid glue in the cavity of the card body before attaching the micromodule.

FIG. 3 illustrates another insetting technique. The card body 110 is produced according to a conventional method, for example by injecting plastics material into a mould. The cavity 120 is obtained either by milling the card body, or by injection at the time of the manufacture of the card body in an adapted mould.

A heat-activated adhesive film 23 is deposited by hot lamination on the dielectric film 15 preferentially before the cutting out of the micromodule 100. The latter is inset in the cavity 120 in the card body 110 and glued by reactivating the heat-activated adhesive 23 by hot pressing by means of a press 24 whose shape is adapted to that of the cavity 120.

These known technologies for manufacturing contact cards have many drawbacks.

They require in fact a large number of operations. When protection by resin is effected, it is generally necessary to mill the resin in order to adapt its shape and thickness, which constitutes a tricky and expensive operation and one which places a stress on the chip.

In particular, the standard technology uses expensive techniques and a high-quality dielectric. The dielectric used is generally made from a glass epoxy composite or Kapton.

This is because the dielectric chosen must have properties of good resistance to temperature in order to be compatible with the insetting techniques described above.

In addition, the geometric definition of the different contacts and connection areas is generally obtained by chemical etching of the metallic grid deposited uniformly on the insulating support. However, chemical etching is an expensive operation.

In the case of a contactless smart card or an electronic label, the micromodule 100 is connected to an antenna 55, as illustrated for example in FIG. 4.

The antenna 55 is produced on an insulating support 52 consisting of PVC or PE or any other suitable material (polyvinyl chloride, polyethylene).

The antenna 55 is produced from a conductive material, in a coil, by screen printing with conductive ink, or by chemical etching of a metal deposited on an insulating support. It can have the shape of a spiral or any other pattern according to the required applications.

The chip 10 is glued and connected to connection areas on a metallic grid 18 by hard wiring 17 or according to any other known method, such as "flip chip" for example.

The chip 10 and its connection wires 16 are then protected by a resin 20 deposited according to the "glob top" technique described above, for example.

The connection between the antenna 55 and the metallic grid 18 can be effected by tin/lead soldering or by conductive gluing or lamination.

The body of the contactless card is then produced by hot lamination of plastic films in order to have the final thickness or by lining a resin between the two dielectric sheets 15 and 52 separated by a strut.

In the case of an electronic label, the antenna, in its definitive form, is chosen by moulding the body of the label around the electronics or by laminating plastic films or by inserting a plastic casing.

These known technologies for manufacturing contactless electronic devices have many drawbacks.

The disadvantages cited above for contactless cards are found again in the method of manufacturing contactless devices.

In addition, protecting the chip is tricky since effecting encapsulation is often impossible given the density of the module on the strip 52, which obliges the manufacturer to effect an overmoulding of the micromodule.

SUMMARY OF THE INVENTION

The aim of the present invention is to mitigate the drawbacks of the prior art.

To this end, the present invention proposes a method for manufacturing an electronic device making it possible to use inexpensive materials and in particular a less expensive dielectric.

In addition, the invention simplifies the step of connecting the chip by producing a metallic grid which is arched so as to place the pads on the chip opposite the connection areas on the grid.

The object of the present invention is more particularly a method for manufacturing an integrated-circuit electronic device, an integrated-circuit chip being attached to a dielectric support and connected to a metallic grid having contact areas and connection areas, characterised in that it includes a step consisting of producing a chip housing on a metallic grid by arching of the latter, the said housing having dimensions making it possible to receive the thickness of the chip and its contact pads, and in that the said grid is laminated on the dielectric support so as to place each contact pad on the chip opposite and in connection with the said connection areas on the grid.

According to one characteristic of the invention, the dielectric support consists of a strip leaving the contact areas on the metallic grid free.

According to another characteristic of the invention, the metallic grid also has a second arch able to encase the thickness of the dielectric strip so as to place the latter flush with the contact areas on the metallic grid.

In a variant embodiment, the dielectric strip consists of a polyethylene terephthalate (PET).

In another variant embodiment, the dielectric strip consists of an acrylonitrile butadiene-styrene (ABS).

In another variant embodiment, the dielectric strip consists of paper.

In another variant, the dielectric strip (60) consists of a polyvinyl chloride (PVC).

According to one characteristic, the dielectric strip has an adhesive surface able to provide the gluing of the chip on the said strip.

According to one characteristic, reference holes and/or targets are produced on the dielectric strip so as to effect a precise gluing of the chip on the said strip.

According to a variant embodiment, the connection of the contact pads on the chip to the connection areas on the grille is effected by laser welding.

According to another variant embodiment, protrusions made from conductive polymer material are deposited on the contact pads on the chip, the connection of the said contact pads to the connection areas on the grille being effected by hot lamination.

According to a first application of the invention, the method includes a step of attaching the micromodule in the cavity of a card body.

The attaching of a micromodule is effected by activation of an adhesive film previously laminated over the entire surface of the metallic grid.

This adhesive film also constitutes an insulant providing the protection of the chip.

According to a second application of the invention, the method includes a step of connecting the micromodule to an antenna.

The chip is then protected by lamination of an insulating film over the entire surface of the metallic grid.

Advantageously, the insulation of the central turns of the antenna is provided by the dielectric strip.

The present invention also relates to an integrated-circuit electronic module, an integrated-circuit chip being attached to a dielectric support and connected to a communication interface having contact areas and connection areas, characterised in that the communication interface consists of an arched metallic grid, the arch defining a chip housing having dimensions making it possible to receive the thickness of the chip and its contact pads, and in that the connection areas on the grid are situated opposite and in connection with the contact pads on the chip.

According to one characteristic, the dielectric support consists of a strip leaving the contact areas free.

According to another characteristic, the metallic grid has two distinct arches, a first arch encasing the thickness of the chip and its contact pads, and a second arch encasing the thickness of the dielectric strip.

According to one characteristic, a protective film is laminated over the entire surface of the metallic grid.

The present invention applies to any portable integrated-circuit device such as smart cards or electronic labels, comprising an electronic module according to the invention.

The present invention makes it possible to obtain, with a simple and economical method, a thin electronic micromodule with good resistance to moisture.

In particular, the method according to the invention makes it possible to use a lower quality dielectric since the latter does not require the conventional properties of compatibility with the usual insetting techniques.

This is because, and this will emerge more precisely below, the dielectric does not cover the contact areas of the metallic grid. However, during insetting, it is these areas which are pressed or glued with a glue of the cyanoacrylate type.

The method according to the invention has the advantage of being able to be implemented in line without interruption.

In addition, the manufacturing method according to the invention has the advantage of considerably simplifying the connection of the chips to the connection areas on the grid.

In addition, the encapsulation and milling steps are completely eliminated, since the chip is protected by the grid and a film laminated over the entire surface of the grid.

BRIEF DESCRIPTION OF THE DRAWINGS

Other particularities and advantages of the invention will emerge from a reading of the following description given by way of illustrative and non-limitative example and made with reference to the accompanying figures, in which:

FIG. 1, already described, is a diagram in transverse section illustrating a traditional method for manufacturing a micromodule;

FIG. 2, already described, is a diagram in transverse section illustrating a traditional method for manufacturing a micromodule with a variant embodiment in the connection of the chip;

FIG. 3, already described, illustrates schematically the insetting of a micromodule according to a known method;

FIG. 4, already described, illustrates schematically the attachment of a micromodule to an antenna according to a known method;

FIG. 5 is a diagram in transverse section of a first embodiment of the manufacturing method according to the present invention;

FIG. 6 is a diagram in transverse section of a second embodiment of the manufacturing method according to the present invention;

FIG. 7 illustrates schematically the insetting of a micromodule according to the method of the invention;

FIG. 8 is a schematic view from below, on the assembly side, of the micromodule obtained by the method according to the invention;

FIG. 9 is a schematic view from above, on the contact side, of the micromodule obtained by the method according to the invention;

FIG. 10 is a schematic diagram of the steps of manufacturing a micromodule according to the invention;

FIG. 11 is a schematic plan view of a third embodiment of the manufacturing method according to the invention;

FIG. 12 is a diagram in transverse section of the attachment of a micromodule according to the invention to a screen-printed antenna.

DESCRIPTION OF THE INVENTION

FIGS. 5 and 6 illustrate first and second embodiments of a micromodule according to the invention.

These first two embodiments apply to smart cards with contact.

An integrated-circuit chip 10 is glued to a dielectric strip 60 laminated on a metallic grid 18 arched once or twice, a first time for encasing the thickness of the chip 10 and its contact pads 11 so as to put the connection areas 19b on the grid 18 opposite the contact pads 11 on the chip 10, and a second time for encasing the thickness of the dielectric strip 60 so as to put the latter flush with the contact areas 19a on the grid 18.

Preferentially, protrusions 12 have previously been produced on each contact pad 11 on the chip 10. These protrusions 12 are intended to improve the electrical connection between the contact pads 11 on the chip 10 and their connection areas 19b on the grid 18. They are consequently necessarily produced from a conductive material, such as for example gold, or from a polymer material loaded with metallic particles.

A protective film 25, having cross-linking adhesive properties, is laminated over the entire surface of the grid 18. This film 25 is not perforated, as was the case in the prior art, in order to leave the chip 10 and its connections free.

The manufacturing method according to the invention comprises at least the following steps.

These steps are illustrated schematically in the diagram in FIG. 10.

A low-cost insulating material is cut into strips. This dielectric 60 can consist of PET (polyethylene terephthalate), PEN (polyethylene nerephthalate), paper, ABS (acrylonitrile-butadiene-styrene), PVC (polyvinyl chloride) or any other known low-cost insulating material.

The dielectric strip 60 can advantageously have a non-conductive adhesive face able to receive the gluing of the chip 10.

When the dielectric 60 is cut out in a strip, reference holes to the pitch of the pattern (for example 9.5 mm) are produced in order subsequently to serve for the gluing of the chip 10 with precision.

According to the variant embodiments, the reference holes can be replaced by targets previously printed on the dielectric 60.

The chip 10 is then glued to the dielectric 60 with precision to the pitch of the chosen pattern.

According to variants, the adhesive of the dielectric strip 60 is thermoactivated for gluing of the chip 10 hot, or is composed of a "tack", which designates an adhesive at room temperature for gluing the chip 10 cold.

It is also possible to effect a deposition of glue on the dielectric 60 and to stick the chip 10 on this deposit of glue.

The precision of the gluing will be ensured by the referencing of the holes and/or targets previously produced on the dielectric strip 60.

In parallel, a metallic grid 18 is produced based on a copper alloy for example, and covered with an electrolytic deposition adapted to the type of connection which it is wished to produce, for example gold or nickel.

According to one particularity of the invention, this grid 18 is arched once or twice according to conventional arching methods, by a punch for example.

In the variant embodiment illustrated in FIG. 5, the grid is arched twice.

A first arch 80 is intended to encase the height of the chip 10 and its protrusions 12 in order to place the connection areas 19b on the grid 11 and the protrusions 12 opposite each other.

A second arch 81 is intended to encase the step on the dielectric strip 60 so as to obtain a micromodule 100 which is perfectly flat on the contact 19a side. Thus the dielectric 60 is flush with the contact areas 19a on the grid 18 whilst leaving them free so as to provide communication from the circuit towards the outside.

The variant embodiment illustrated in FIG. 6 has only the first arch 80.

The grid 18 and the dielectric 60 are then laminated.

The second arch 81 facilitates the lamination of the dielectric 60 on the grid 18 whilst forming a guide for the dielectric strip 60.

The lamination, carried out by means of the references on the dielectric strip 60 and/or by means of the second arch 81, put the connecting areas at 19b on the grid 18 opposite the contact pads 11 possibly provided with protrusions 12 on the chip 10.

It should be noted that, the chip 10 being connected below the grid 18, the contact areas 19a on the grid 18 will be directly in correspondence, via the connection areas 19b, with the pads 11 on the chip 10. Consequently the problem of having to produce an adapted and complex pattern, as is the case in the connections according to the "flip chip" methods described above, will not be posed.

It is then necessary to effect the connections of the pads 11 on the chip 10 to the connection areas 19b on the grid 18.

To this end, different known methods can be used, such as for example laser welding methods, or deposition of an anisotropic adhesive or a thermocompression method, or by activation of the conductive polymer protrusions previously deposited on the contact pads 11 on the chip 10.

It is advantageous, as already disclosed with reference to the prior art, to laminate an adhesive 25 which can be reactivated by heat or pressure over the entire useful surface of the grid 18.

Advantageously, the adhesive 25 has insulating properties in order to constitute additional protection for the chip 10. This is because the adhesive 25 is not perforated as was routinely the case in the prior art.

Depositing a protective resin on the chip 10 can therefore be completely excluded in this manufacturing method.

The micromodule 100 is then cut out by means of a punch or a laser beam, and then fitted in the cavity of a card body by reactivating the adhesive 25 or depositing a drop of glue of the cyanoacrylate type, for example, in the cavity.

FIG. 7 illustrates the step of insetting the micromodule 100 in the cavity 120 of the card body 100, by the technique of hot pressing in order to reactivate the adhesive 25.

This figure shows clearly that hot pressing is not applied to the dielectric 60, but solely to the metallic grid 18, the punch 24 having a recess corresponding to the dielectric 60.

Likewise, if a technique of attachment with a glue of the cyanoacrylate type had been chosen, the glue would have been applied between the cavity 120 of the card body 100 and the metallic grid 18 covered or not with the adhesive 25, and not on the dielectric 60.

FIGS. 8 and 9 illustrate respectively schematic views from below and above of the micromodule obtained by the method according to the invention applied to contact cards.

FIGS. 5 and 6 are sections A—A of FIG. 8.

FIG. 8 shows clearly the arches 80 and 81 on the metallic grid 18, the first delimiting the contact areas 19a and the connection areas 19b, and the second possibly delimiting the zone of the dielectric strip 60.

FIG. 9 shows the external side of the micromodule, on the ISO contacts side.

According to one of the variants, disclosed previously, the dielectric strip 60 is flush with the contact areas 19a on the metallic grid 18. The outside of the smart card thus obtained is therefore perfectly flat.

In the other variant, the dielectric strip 60 will form a small step on the top of the contact areas 19a.

In addition, the connection terminal block 18 on the chip card obtained has a middle zone corresponding to the dielectric strip 60 on which a logo or drawing can be printed (preferentially directly at the time of cutting out of the insulating material in strip form). This face of the dielectric strip 60 can possibly be in different colours and/or carry the serial number of the card.

FIGS. 11 and 12 illustrate a third embodiment of a micromodule according to the invention which applies to contactless cards or electronic labels.

FIGS. 11 and 12 illustrate respectively a plan view and a view in transverse section of the manufacturing method according to this third embodiment of the invention.

The method described previously for contact cards is repeated, the operation of laminating the arched grille 18 on the dielectric 60 being all the easier since the number of contact pads 18 on the chip 10, with or without protrusion 12, to be connected to the connection areas 19b, is only two.

Moreover, protection of the chip 10 is obtained by laminating a solid film 26 over the entire surface of the micromodule 100. All the problems of the prior art related to the deposition of a drop of resin for protection by encapsulation or overmoulding are therefore avoided.

In addition, as illustrated in FIG. 11, it is possible, in the context of this application, to laminate as many dielectric strips 60 as possible in order to optimise the number of micromodules on a grid 18.

FIG. 12 illustrates the connection of the micromodule 100 with an antenna 50, carried out according to standard techniques.

Advantageously, the dielectric 60 can serve to isolate the contacts 55 from the other turns on the antenna 50, in the case of a screen-printed antenna. This makes it possible to avoid the screen printing of an insulant on the central turns.

What is claimed is:

1. A method for manufacturing a portable integrated-circuit electronic device having a module comprising an integrated-circuit chip attached to a dielectric support and connected to a metallic grid having contact areas and connection areas, comprising the steps of producing a housing for a chip on a metallic grid by arching the grid, said housing being dimensioned to receive the thickness of the chip and its contact pads, and laminating said grid on the dielectric support to place each contact pad on the chip opposite and in connection with a corresponding connection area on the grid.

2. A manufacturing method according to claim 1, wherein the dielectric support comprises a band leaving the contact areas on the metallic grid free.

3. A manufacturing method according to claim 2, wherein the metallic grid also has a second arch to encase the thickness of the dielectric strip so as to place the dielectric strip flush with the contact areas on the metallic grid.

4. A manufacturing method according to claim 1 wherein the dielectric strip comprises a polyethylene terephthalate (PET).

5. A manufacturing method according to claim 1 wherein the dielectric strip comprises an acrylonitrile-butadiene-styrene (ABS).

6. A manufacturing method according to claim 1 wherein the dielectric strip comprises paper.

7. A manufacturing method according to claim 1 wherein the dielectric strip comprises a polyvinyl chloride (PVC).

8. A manufacturing method according to claim 1 wherein the dielectric strip has an adhesive surface for gluing the chip on said strip.

9. A manufacturing method according to claim 1 further including the step of producing reference and/or target holes on the dielectric strip to effect a precise gluing of the chip on said strip.

10. A manufacturing method according to claim 1 wherein the connection of the contact pads on the chip to the connection areas on the grid is effected by laser welding.

11. A manufacturing method according to claim 1 further including the steps of depositing protrusions made of conductive polymer material on the contact pads on the chip, and connecting the contact pads on the chip to the connection areas on the grid by hot lamination.

12. A manufacturing method according to claim 1 further including a step of attaching the module in the cavity of a card body.

13. A manufacturing method according to claim 12, wherein the attachment of the module is effected by activation of an adhesive film previously laminated over the entire surface of the metallic grid.

14. A manufacturing method according to claim 13, wherein the adhesive film also constitutes an insulant providing protection of the chip.

15. A manufacturing method according to claim 1 further including a step of connecting the module to an antenna.

16. A manufacturing method according to claim 15, wherein the chip is protected by lamination of an insulating film over the entire surface of the metallic grid.

17. A manufacturing method according to claim 15, further including the step of insulating central turns of the antenna with the dielectric strip.

18. An integrated-circuit electronic module comprising an integrated-circuit chip attached to a dielectric support and connected to a communication interface having contact areas and connection areas, wherein the communication interface includes an arched metallic grid, the arch defining a housing for a chip and being dimensioned to receive the thickness of the chip and its contact pads, and wherein the connection areas on the grid are situated respectively opposite and in connection with the contact pads on the chip.

19. An electronic module according to claim 18, wherein the dielectric support comprises a strip leaving the contact areas free.

20. An electronic module according to claim 19, wherein the metallic grid has two distinct arches, a first arch encasing the thickness of the chip and its contact pads, and a second arch encasing the thickness of the dielectric strip.

21. An electronic module according to claim 18 further including a protective film disposed over the entire surface of the metallic grid.

22. A portable integrated-circuit device such as a smart card or an electronic label, containing an electronic module comprising an integrated-circuit chip attached to a dielectric support and connected to a communication interface having contact areas and connection areas, wherein the communication interface includes arched metallic grid, the arch defining a housing for a chip and being dimensioned to receive the thickness of the chip and its contact pads, and wherein the connection areas on the grid are situated respectively opposite and in connection with the contact pads on the chip.

* * * * *